United States Patent [19]
Eggermont et al.

[11] 3,988,607
[45] Oct. 26, 1976

[54] INTERPOLATING DIGITAL FILTER

[75] Inventors: Ludwig Désiré Johan Eggermont; Hendrik Arie Van Essen; Petrus Josephus Van Gerwen; Wilfred André Maria Snijders, all of Eindhoven, Netherlands

[73] Assignee: U.S. Philips Corporation, New York, N.Y.

[22] Filed: Aug. 25, 1975

[21] Appl. No.: 607,630

[30] Foreign Application Priority Data
Sept. 16, 1974 Netherlands............................ 12224

[52] U.S. Cl................................ 235/156; 325/42; 328/167
[51] Int. Cl.²..................... G06F 7/38; G06F 15/34
[58] Field of Search............ 235/152, 156; 328/162, 328/167; 325/42, 65; 333/18, 28, 70 T

[56] References Cited
UNITED STATES PATENTS

| | | | |
|---|---|---|---|
| 3,303,335 | 2/1967 | Pryor | 235/152 UX |
| 3,633,014 | 1/1972 | Lemp, Jr. et al. | 235/152 |
| 3,633,105 | 4/1972 | Lender et al. | 325/42 |
| 3,639,848 | 2/1972 | Elliot | 328/167 |
| 3,699,321 | 10/1972 | Gibson | 235/152 |
| 3,794,816 | 2/1974 | Esteban | 235/152 |

Primary Examiner—Joseph F. Ruggiero
Attorney, Agent, or Firm—Frank R. Trifari; Daniel R. McGlynn

[57] ABSTRACT

An interpolating non-recursive digital filter in which the circulating storage device which has a periodically changing storage time, is controlled by a clock-pulse generator, and has an output circuit whereby within one input sampling period the input code words stored in the storage device are supplied a predetermined number of times to the multiplying device.

7 Claims, 4 Drawing Figures

INTERPOLATING DIGITAL FILTER

BACKGROUND OF THE INVENTION

1. Field of the invention

The invention relates to a non-recursive digital filter for generating binary output code words which occur at a given output sampling frequency $f_2$ and are related in a predetermined manner to a sequence of binary input code words which occur at an input sampling frequency $f_1$, the output sampling frequency $f_2$ being an integral multiple ($m$) of the input sampling frequency $f_1$. This digital filter comprises a storage device arranged to store a given number (N) of successive inpupt code words; a multiplying device for forming, within one input sampling period $1/f_1$, a number ($m$) of sets of products of the said given number (N) of input code words and a number ($m$) of different sets of weighting factors which correspond to the relationship between the input and the output code words; an adding device which is coupled to the said multiplying device and is adapted to generate, within one input sampling period $1/f_1$, a number of output codewords, which number corresponds to the number ($m$) of sets of products, each output code word being at least equal to the mathematical sum of all of the products of one particular set of products.

Such a digital filter arranged for increasing the sampling rate is known as an interpolating digital filter.

2. Description of the prior art

In a prior art interpolating non-recursive digital filter the storage device has the form of a delay line comprising a plurality (N) of delay sections each being arranged to store a single input code word. These delay sections are each connected to an adding device via a tapping which includes a multiplier. To each multiplier a weighting factor from a given set of weighting factors is supplied.

In particular, in the prior art digital filter, the input code words are subjected to a predetermined sequence of arithmetical operations to product an output code word. These operations can mathematically be represented by the convolution sum:

$$y[(n+q/m)T] = \sum_{k=0}^{N-1} C[q,k] \, x[(n-k)T]$$

where $q = 0, 1, 2, 3, \ldots, m-1$.

In this expression:

$m$ is an integer denoting the relationship between the input and output sampling frequencies ($m = f_2/f_1$);

N is an even number indicating the number of input code words stored in the input circuit;

T is the reciprocal value of the input sampling frequency $T = 1/f_1$;

$x[(n-k)T]$ is one input code word of the code words which occur with a period $T = 1/f_1$;

$n$ is the ordinal number of the code word which occurs after the instant $t = 0$;

$y[(n + q/m)T]$ is one of the output code words which occur with a period $T/m$;

$C[q, k]$ is a weighting factor.

It should be noted that the weighting factors are commonly termed "filter coefficients" and are stored in a storage device such as, for example, a ROM.

However, to permit the above-described interpolating filter to perform the given mathematical operations it must have a size and a dissipation such that its practical usefulness is greatly restricted, for example with respect to the possibility of time multiplex processing of information signals.

SUMMARY OF THE INVENTION

It is an object of the present invention to provide an interpolating non-recursive digital filter the size and dissipation of which are reduced to an extent such that it can be manufactured by meanas of integrated-circuit techniques, such as for example I$^2$L, while time-sharing can be used for performing various filter functions on a given sequence of input signal samples and/or a single filter function on a given plurality of sequences of input signal samples.

According to the present invention this is achieved by providing a storage device for storing the given number (N) of successive input code words in the form of a circulating storage device which has a periodically changing storage time, is controlled by a clock-pulse generator, and has an output circuit whereby within one input sampling period $1/f_1$ the input code words stored in the storage device are supplied a predetermined number of times to the multiplying device. A predetermined number of times equal to the integral multiple ($m$), while the code words delivered by the said output circuit occurs sequentially.

The said storage device may take the form of a shift-register each register section of which is arranged to store a complete code word, however, as an alternative a RAM may be used.

DESCRIPTION OF THE INTERPOLATING DIGITAL FILTER

The interpolating digital filter in general

Figure 1:
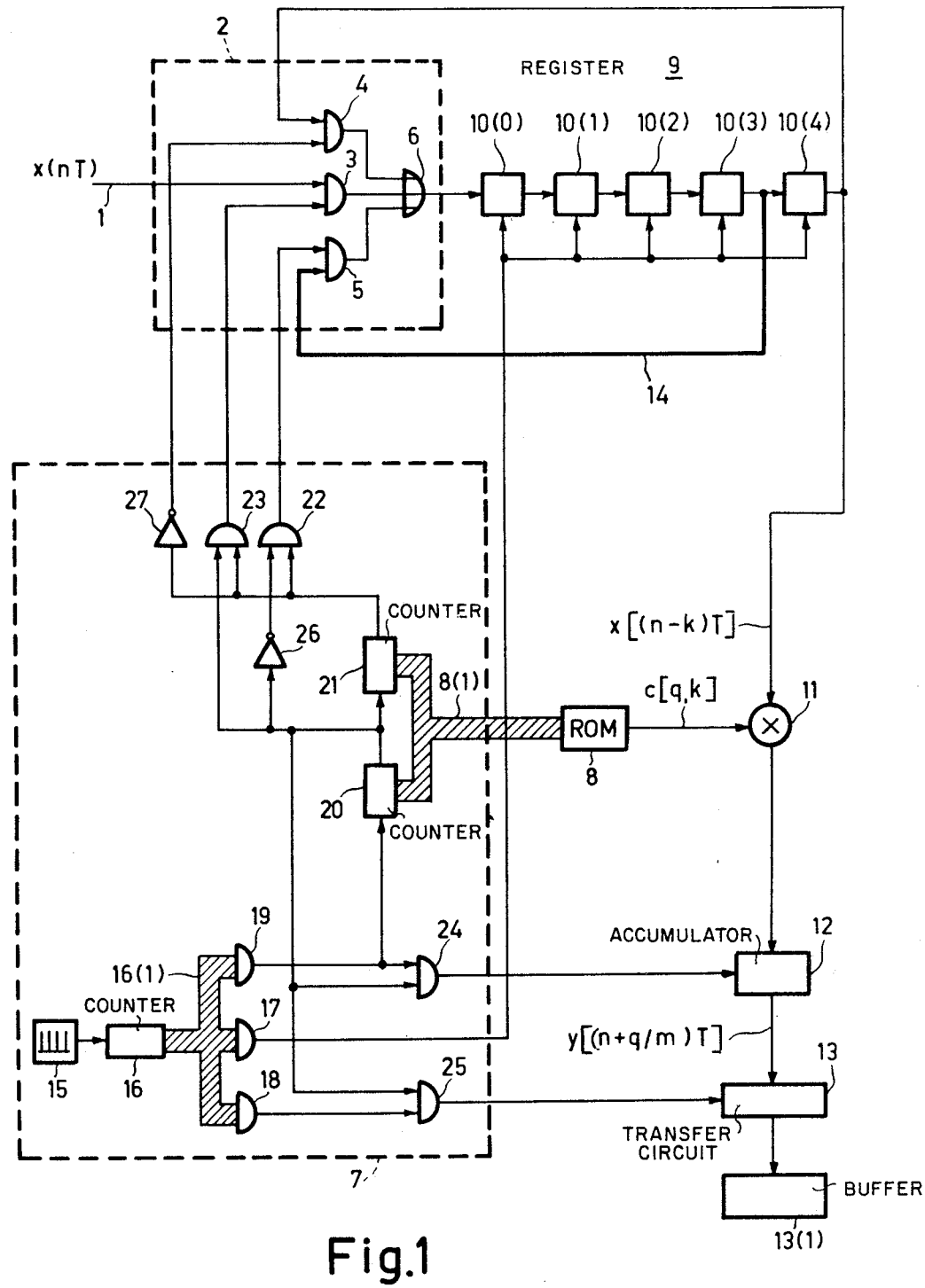
FIG. 1 shows a non-recursive digital filter according to the invention.

FIG. 1 shows an interpolating non-recursive digital filter according to the invention. This filter may form part, for example, of a receiver of a PCM telecommunication system. It has an input circuit 1 to which the input signal to be filtered is supplied. This input signal, which in the Figure is denoted by $x(nT)$, comprises a sequence of binary-coded samples of an analog information signal, which samples have been taken at a frequency $f_1$ which hereinbefore has been termed the input sampling frequency. The said binary-coded samples, which in general are termed "code words," are generated, for example, in the transmitter of the said PCM telecommunication system. For processing in the digital filter shown in FIG. 1 the said input code words which occur sequentially with a period $T = 1/f_1$ are each supplied to a switching device 2 which comprises three AND gates 3, 4 and 5 and an OR gate 6, the AND gates 3, 4 and 5 having clock pulses supplied to them by a clock-pulse generator 7.

In this digital filter the input code words $x(nT)$ are processed according to the mathematical expression set out hereinbefore, while the various sets of filter coefficients $C[q, k]$, which are characterized by the values of $q$ and in which $k = 0, 1, 2, \ldots, (n-1)$, are stored in a storage device 8, for example a ROM.

If in the switching device 2 the AND gate 3 is opened by a clock pulse from the generator 7, the sequentially occurring code words $x(nT)$ are written in a storage device 9 which in this embodiment is in the form of a shift register having five register sections 10(0) to 10(4) each arranged to store a complete input code word. In this shift register successive input code words are stored in successive register sections. Whenever a new code word is written in this register, the stored code words are shifted one position and the oldest code word stored disappears from the register. In symbolic representation, after a new input code word has been written in the register the register sections 10(0) to 10(4) contain the code words $x(n)$, $x(n-1)$, $x(n-2)$, $x(n-3)$ and $x(n-4)$ respectively.

After a new input code word has been written in the store, the AND gate 3 is closed and the AND gate 4 is opened by a control pulse from the generator 7, in which condition the last register section 10(4) is connected to the first or input register section 10(0) so that a circulating shift register is obtained.

Writing-in a new input code word is followed by a computing cycle in which clock pulses are supplied to the register sections and control pulses are supplied to the ROM 8. As a result, a filter coefficient and the corresponding code word stored in the last register section 10(4) are supplied to inputs of a multiplier 11 which forms the product of these two code words and supplies it to an accumulator 12. In this embodiment the accumulator 12 has been reset to zero at the instant at which a new input code word is inserted into the shift register 9. After all the input code words stored in the register 9 have been multiplied once by a filter coefficient and the resulting products have been summed in the accumulator 12, that is to say at the end of the computing cycle, the accumulator is reset to zero. However, each time before the accumulator is reset to zero the code word then stored in the accumulator is read out by means of a transfer circuit 13. This code word constitutes the output code word $y(n + q/m)T$ which in this embodiment, for example, is written in a buffer 13(1) which may be in the form of a shift register. Under control of clock pulses from the generator 7 the bits of the said output code words can be read, for example serially, from the register 13(1).

It should be mentioned that the bits of the numbers $x(nT)$, $y[(n + q/m)T]$ and $C[q, k]$ can occur in series and in parallel and can be stored in the various storage elements in both forms. Hence no distinction will be made between these two forms in the Figures or in the text of this specification.

In order to implement an interpolating digital filter, i.e., in order to generate a given number $m$ of output code words ($m>1$), within a period T of the input code words, the abovedescribed computing cycle is repeated a number of times, namely $m$ times. For each of these computing cycles the same set of input code words is used, however, for different computing cycles within the said period T different sets of filter coefficients are used which are interrelated in a manner to be described hereinafter.

THE INTERPOLATING DIGITAL FILTER IN DETAIL

In order to ensure that the output code words $y[(n + q/m)T]$ are all available at equal time intervals of $T/m$, the shift register 9 is constructed as a shift register having a periodically varying storage or delay time. More particularly, in this embodiment it is a shift register of periodically varying length. For this purpose the output of the register section 10(3) is connected to the first register section 10(0) by a back-coupling line 14 and via the AND gate 5 and the OR gate 6. At an instant to be defined hereinafter this back-coupling line is activated by the clock pulse generator 7 which for this purpose at the said instant delivers a pulse which opens the AND gate 5 and closes the AND gates 3 and 4.

The operation of the shift register 9 will now be described in more detail with reference to Table I for the case in which $m = 2$ and $N = 5$. In this Table I columns 10(0) to 10(4) show the contents of the register sections 10(0) to 10(4) respectively and column 5 shows the filter coefficient by which the input code word stored in section 10(4) (column 10(4)) is multiplied.

The rows which in this Table I are denoted by three reference characters $p$, $r$ and $s$ ($p = 1, 2, 3, 4$; $r = 1, 2$; $s = 1, 2, 3, 4, 5$) each indicate the sequence of the stored code words which occurs in the shift register 9 at a given instant. Such a sequence of code words will hereinafter be termed the state of the shift register 9. A given state, for example that denoted by 1.1.3, passes to the succeeding state 1.1.4 under control of a shift pulse. The states 1.1.1, 2.1.1, 3.1.1 and 4.1.1 are those which occur immediately after insertion of a new code word, namely the code words $x(n)$, $x(n+1)$, $x(n+2)$ and $x(n+3)$ respectively.

After the insertion of a new input code word, for example the code word $x(n)$, the first computing cycle takes place, the shift register 9 being successively in the states 1.1.1 to 1.15 shown in Table I. When in state 1.1.5 the multiplication $x(n).C(O,O)$ has been performed, the contents of the accumulator are read out and the accumulator is reset to zero. Subsequently the second computing cycle takes place, the shift register 9 passing through the state 1.2.1 to 1.2.5. When at the beginning of this second computing cycle the shift register 9 has been brought into the state 1.2.1, the AND gate 4 is closed and the AND gate 5 is opened so that on the occurrence of further shift pulses the contents of the register section 10(3) is written both in the register section 10(4) and in the first register section 10(0). Consequently the oldest code word $x(n - 4)$ stored in the register 9 is lost from this register 9 after the beginning of the second computing cycle and at each shift pulse a same code word is written in the first and last register sections 10(0) and 10(4) respectively.

When the last multiplication in the sampling period under consideration has been performed, the AND gate 5 is closed and the AND gate 3 is opened while the AND gate 4 remains closed. As a result, at the instant of occurrence of a shift pulse a new input code word $x(n+1)$ is written in the register section 10(0) whilst simultaneously the code words stored in the register 9 are shifted one position. Immediately after insertion of the code word $x(n+1)$ the first of two new computing cycles begins, the shift register states being indicated in the Table by the references in which $p$ has the value 2. The Table further shows the two computing cycles which follow after the insertion of the code word $x(n +$ 2). The shift register states associated with these computing cycles are denoted by the references in which $p$ has the value 3.

Thus the use of the feedback line 14 ensures that already during the last computing cycle within a given sampling period the input code words in the shift register are shifted so that the state of the shift register during performance of the last multiplication of the said last computing cycle, for example the multiplication $x(n).C(1,0)$ in the state 1.2.5 of the shift register (see the Table), is equal to the state of the shift register immediately after insertion of a new input code word at the beginning of the sampling period considered, however, the initially oldest input code word has disappeared from the register 9 (compare the states 1.2.5 and 1.1.1 of the Table). This ensures that the shift pulses for the shift register 9 continually occur successively with the same period.

That the use of the feedback lines results in the shift register having a periodically varying storage or delay time can be illustrated with reference to column 10(4) of Table I. We will consider, for example, the code word $x(n - 1)$. The Table shows that in order to be multiplied by a filter coefficient this code word is present in the register section 10(4) during the shift register states 1.14; 1.2.4; 2.1.3; 3.1.2; 3.2.2; 4.1.1. Because the time interval between two successive states of the shift register is equal to one shift period $T/Nm$, the time interval between shift register states 1.1.4 and 1.2.4 is equal to $5T/Nm$, that between states 1.2.4 and 2.1.3, however is equal to $4T/Nm$ only; that between the states 2.1.3 and 2.2.3 equal to $5T/Nm$ again; that between states 2.2.3 and 3.1.2 equal to $4T/Nm$ again, and so on.

As will be seen from Table I, the use of a shift register having a periodically varying delay time ensures that all the computing cycles have the same duration and the output code words $y[(n + q/m)T]$ all occur at equidistant instants.

Although after the insertion of an input code word in the register 9 the embodiment shown in FIG. 1 and described with reference to Table I delivers only two output code words, the number of output code words may be increased at will. However, such increase also results in an increase in the number of sets of filter coefficients.

CONTROL CIRCUIT

As has been mentioned hereinbefore, the various elements of the digital filter are controlled by the clock pulse generator 7. More particularly, this clock pulse generator includes an oscillator 15 which delivers output pulses at a frequency $3Nmf_1$, where N is the number of shift register sections of the register 9 and $m$ again is the number of desired output code words per input sampling period T. The output of this oscillator 15 is connected to the input of a first binary divider or counter 16 which in this embodiment divides the output frequency of the oscillator by a factor of three. Given sections of this counter 16 are connected to inputs of AND gates 17, 18 and 19. The connections are schematically shown in the Figure by a shaded area 16 (1). The output of AND gate 17 is connected to the clock pulse inputs of the shift register sections 10(.). The output of AND gate 19 is connected to the input of a second binary divider or counter 20 the output of which is connected to the input of a third binary divider or counter 21.

The clock pulse generator shown further comprises four AND gates 22 to 25 and two inverters 26 and 27. These AND gates and inverters are connected in the manner shown in the Figure to the outputs of the counters 20 and 21 and of the AND gates 18 and 19.

Figure 2:
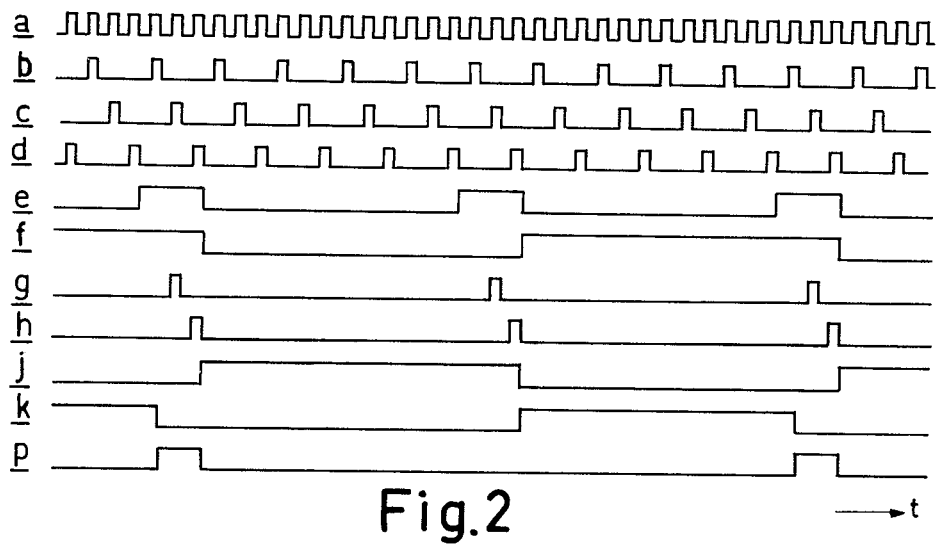
FIG. 2 shows waveforms illustrating the operation of the digital filter shown in FIG. 1.

The operation of the clock pulse generator shown will now be described more fully with reference to the waveforms shown in FIG. 2 for the case where N = 5 and $m$ = 2. In FIG. 2 the train of clock pulses generated by the oscillator 15 is shown at $a$. The counter 16 divides the output frequency of this oscillator 15 by a factor of three and thus defines cycles of three successive output pulses of the oscillator 15. The first clock pulse of such a cycle causes the AND gate 17 to deliver an output pulse, the second clock pulse of such a cycle causes the AND gate 18 to deliver an output pulse and the third clockpulse of such a cycle causes the AND gate 19 to deliver an output pulse. The resulting trains of output pulses of the AND gates 17, 18 and 19 are shown in FIG. 2 at $b$, $c$ and $d$ respectively.

After each cycle of N = 5 output pulses from the AND gate 19 the counter 20 delivers an output pulse and thereby determines the end of a computing cycle of the filter. The output pulses of the counter 20 are shown in FIG. 2 at $e$. The output pulse of AND gate 18 which occurs during this output pulse of counter 20 causes the AND gate 25 to deliver an output pulse which results in that the contents of the accumulator 12 are written, via the transfer circuit 13, in the buffer 13(1). The pulse delivered by the AND gate 19 during the occurrence of the output pulse of counter 20 resets the accumulator 12 to zero via the AND gate 24. The said output pulses of the AND gates 25 and 24 are shown in FIG. 2 at $g$ and $h$ respectively.

The counter 21 is arranged to count $m$ output pulses from the counter 20 and in doing so passes cyclically through the counts zero up to and including $m - 1$. As long as the counter 21 has not reached the count $m - 1$, it delivers at its output a binary "0" which is supplied to AND gate 4 via the inverter 27. Thus the AND gate 4 is opened and during the first $m - 1$ computing cycles the contents of the shift register 9 are circulated via this AND gate 4. When the count $m - 1$ is reached the counter 21 delivers a binary 1. As a result the AND gate 4 is closed and the AND gates 22 and 23 are opened. During the following new cycle of the counter 20 the AND gate 22 is open owing to the provision of the inverter 26 and delivers a binary 1 so that the AND gate 5 is opened and during the last computing cycle within a given sampling period T the circulating state of the shift register is established via the AND gate 5. When eventually in this last cycle of the counter 20 the $N^{th}$ output pulse from the AND gate 19 is applied to the counter 20, the AND gate 22 again delivers a binary 0 so that the AND gate 5 is closed and hence all backcoupling paths of the register 9 are interrupted. Also the AND gate 23 now supplies a binary 1 to the AND gate 3, permitting a new code word to be written in the register, and finally the said $N^{th}$ pulse resets the counter 21 to zero. The output pulses delivered by the counter 21, the inverter 27 and the AND gates 22 and 23 are shown in FIG. 2 at $f$, $j$, $k$ and $p$ respectively.

It should be mentioned that reading a filter coefficient from the ROM 8 can be effected in known manner, for example in that each instant the counts of the counters 20 and 21 are jointly considered as one address code for the ROM. For this purpose all the sections of the two counters 20 and 21 are connected to corresponding inputs of the ROM 8, as is shown schematically in FIG. 1 by the shaded area 8(1).

THE RELATIONSHIP BETWEEN THE FILTER COEFFICIENTS TO BE USED IN THE INTERPOLATING DIGITAL FILTER

As has been mentioned with reference to Table I, each computing cycle within a given input sampling period is associated with a set of filter coefficients $C(q, k)$. In the said Table, for the first computing cycle within the said sampling period the set of filter coefficients $C(q, k)$ is characterized by $q = 0$, and for the second computing cycle within the sampling period considered, which cycle is the last one in the Table, the said set is characterized by $q = 1$. As has been mentioned hereinbefore and as is indicated in the Table, for a given filter these sets of filter coefficients are the same for all sampling periods. The filter coefficients of a set are equal in magnitude to the individual samples of a sequence of samplings of the pulse response of the desired filter. For use in the filter the said samples are usually quantized and encoded, for example in a binary number.

To illustrate the relationship between the sets of filter coefficients FIG. 3a shows the pulse response, limited to the time interval from −6T to +10T, of an ideal low-pass filter having a cut-off frequency $\omega_o/2$. As is known, this pulse response has a shape given by the function $(\sin x)/x$. More particularly the pulse response shown can be represented by the mathematical expression $$\frac{\omega_0}{2\pi} \cdot \frac{\sin (t-2T) \omega_0/2}{(t-2T) \omega_0/2}$$

First we will consider the said low-pass filter as a non-interpolating one, that is to say a filter in which the input and output sampling frequencies are equal. It is assumed that these sampling frequencies are equal to four times the cut-off frequency of the filter. The sampling period then is equal to $T = \pi/\omega_o$.

To determine the filter coefficients the pulse response of the filter is sampled with the train of sampling pulses shown in FIG. 3b. It is assumed that these sampling pulses occur at instants $t = k.T$. In known manner this train can be represented mathematically by $$\sum_{k=-\infty}^{\infty} \delta(t-kT)$$

Figure 3:
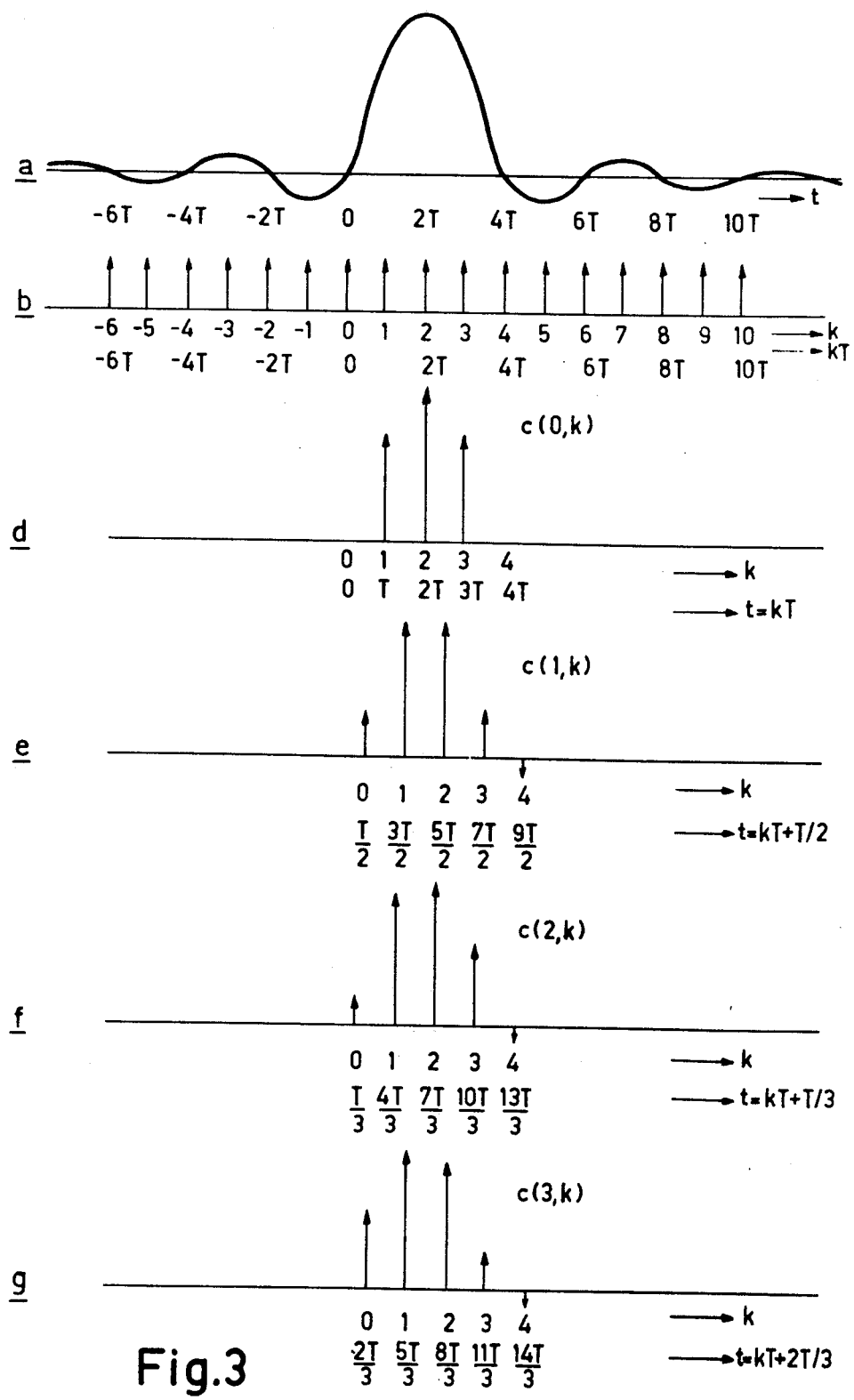
FIG. 3 shows graphs illustrating the choice of the filter coefficients to be used in an interpolating digital filter.

The five filter coefficients which are used in the filter shown in FIG. 1 for approximating to the desired transfer characteristic now are constituted by those samples of the pulse response which occur at the instants for which $k = 0, 1, 2, 3, 4$, respectively. For the resulting filter coefficients which together form a set $C(O, k)$ the respective magnitudes are shown at $d$ in FIG. 3. In this Figure not only the parameter values $k$ but also the instants at which the relevant filter coefficient occurs as an instantaneous signal value for the pulse response shown in FIG. 3a are plotted along the abscissa.

When the low-pass filter having the pulse response shown in FIG. 3a is to be used as an interpolating filter in which the output sampling frequency is equal to twice the input sampling frequency, i.e., with an output sampling period equal to $T/2 = \pi/2\omega_o$, in order to obtain a first output code word the input code words stored in the register 9 shown in FIG. 1 are first multiplied by the above-mentioned set of filter coefficients $C(O, k)$, while for obtaining a second output code words are also multiplied by a second set of filter coefficients $C(1, k)$. This second set of filter coefficients is shown in FIG. 3e. These filter coefficients again are equal to the samples of the pulse response shown in FIG. 3a and sampled with a period T. Here also said sampling of the pulse response has been effected with a pulse train of the shape shown in FIG. 3b, however, with respect to this pulse train it has been shifted in time by $T/2 = + \pi/2\omega_0$, so that the train of sampling pulses for the second set of filter coefficients can be represented mathematically by:

$$\sum_{k=-\infty}^{\infty} \delta[t-(kT+T/2)]$$

Thus the filter coefficients $C(1, k)$ are the samples of the pulse response shown in FIG. 3a which are taken at the instants $kT + T/2$, where $k = 0, 1, 2, 3, 4$.

For completeness FIG. 3 at $f$ and $g$ shows the sets of filter coefficients for the case where the output sampling frequency of the interpolating filter is thrice its input sampling frequency. In this case, within an input sampling period the input code words stored must be multiplied once by the set of filter coefficients $C(0, k)$ (see FIG. 3d), once by the set of coefficients $C(2, k)$ (see FIG. 3f), and once by the set $C(3, k)$ (See FIG. 3g). The said sets of filter coefficients $C(2, k)$ and $C(3, k)$ also are obtained by sampling the pulse response shown in FIG. 3a, the train of sampling pulses again having the same shape as in FIG. 3b, however, the said trains are shifted with respect to the latter train by time intervals T/3 and 2T/3 respectively. In analogy with the above, the latter pulses can be mathematically represented by:

$$\sum_{k=-\infty}^{\infty} \delta[t-(kT+T/3)]$$

and $$\sum_{k=-\infty}^{\infty} \delta[t-(kT+2T/3)]$$

respectively.

An interpolating digital filter has effects not only in the time domain but also in the frequency domain, for if a band-limited analog base-band signal is sampled at an input sampling frequency $f_1$ the frequency spectrum of this sampled signal is constituted by the initial base-band spectrum and by repetitions of this spectrum at integral multiples of the sampling frequency $f_1$. Thus the first repetition of the initial base-band spectrum lies around the sampling frequency $f_1$. In PCM transmission systems this frequency $f_1$ is usually selected so that the first repetition immediately adjoins the base-band spectrum. By increasing the sampling frequency $f_1$ by a factor of $m$ by means of an interpolating digital filter the first repetition of the base-band spectrum occurs around the output sampling frequency $mf_1$. This ensures that the said first repetition of the spectrum no longer immediately adjoins this base-band spectrum and consequently the latter can be selected by means of a simple low-pass filter.

Hereinbefore it was set out how signal samples can be interpolated in a sequence of signal samples of a base-band signal by means of a low-pass filter. Similarly signal samples may be interpolated, for example by means of a band-pass filter, in a sequence of signal samples which is obtained by sampling a signal not situated in the base band, for example a single-sideband signal modulating a carrier.

DESCRIPTION OF FIG. 4

Figure 4:
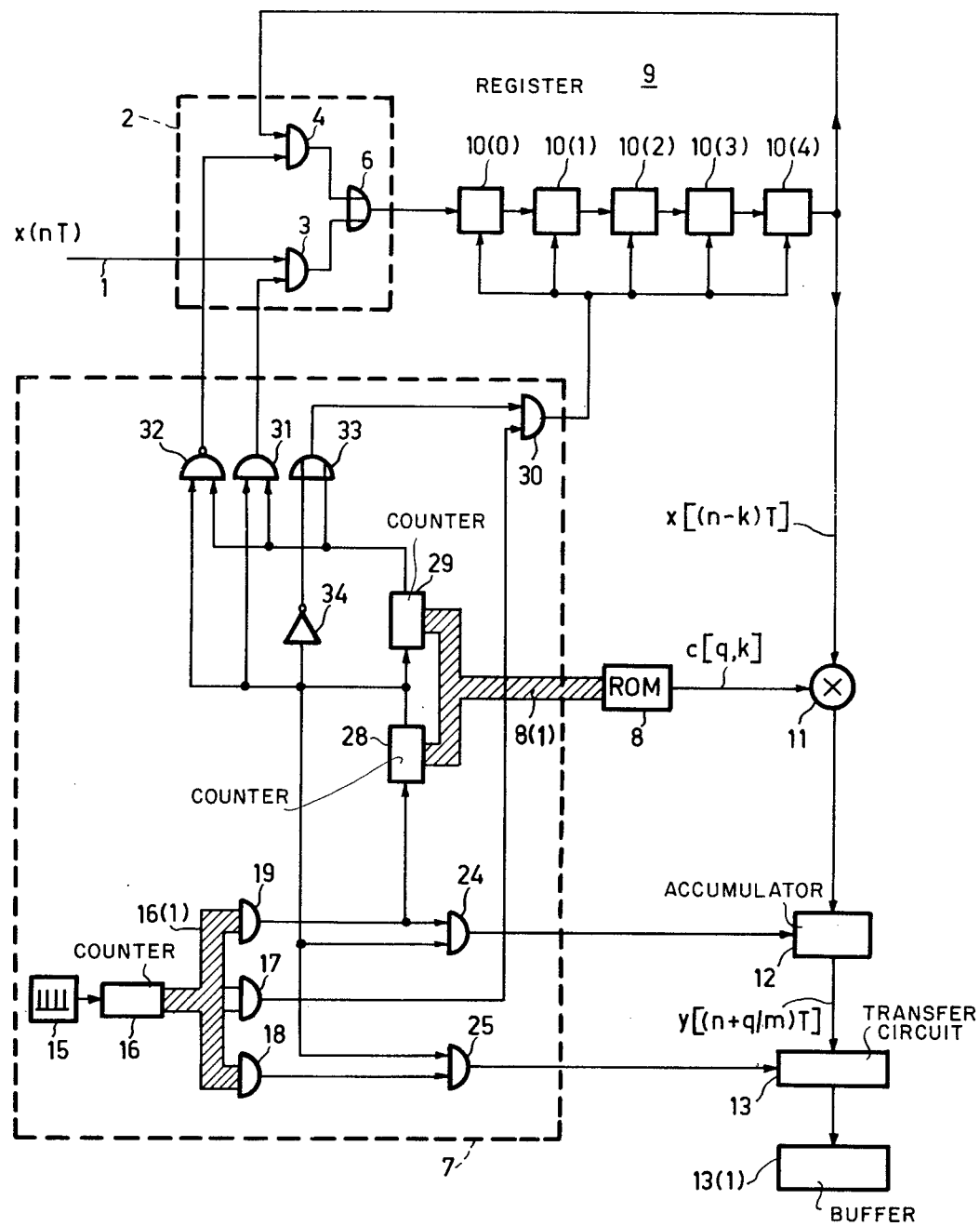
FIG. 4 shows a modified embodiment of the interpolating digital filter shown in FIG. 1.

FIG. 4 shows a modified embodiment of the interpolating digital filter shown in FIG. 1. The embodiment of FIG. 4 is largely similar to that of FIG. 1 and elements corresponding to those shown in FIG. 1 are designated by like reference numerals. The embodiment shown in FIG. 4 differs from that shown in FIG. 1, however, in that in order to obtain a shift register 9 having a periodically varying storage or delay time and to obtain computing cycles of equal duration the input of the last register section 10 (4) is not connected via a feedback line and an associated gate circuit to the input of the first register section 10(0), as is the case in FIG. 1, but in that given shift pulses for the register 9 are suppressed. Thus in the embodiment shown in FIG. 4 the periodically varying delay time of the register 9 is obtained only by the operation of the clock pulse generator 7.

This clock pulse generator 7 is partly constructed in the same manner as the clock pulse generator shown in FIG. 1 and also includes a clock pulse oscillator 15 which delivers clock pulses at a frequency $3Nmf_1$. Here also N represents the number of sections of the shift register 9, $m$ represents the number of output samples to be generated in an input sampling period $T$ and $f_1$ represents the input sampling frequency, where $f_1 = 1/T$. The said clock pulses are supplied to a binary divider or counter 16 which divides the pulse frequency of this oscillator 15 by a factor of three. Similarly to the embodiments of FIG. 1 given elements of the counter 16 are connected to AND gates 17, 18 and 19 which withiin the cycle of three clock pulses considered are caused to deliver a pulse by the first, second and third clock pulses respectively of the oscillator 15. The pulses delivered by the AND gates 18 and 19 are applied to the transfer circuit 13 and the accumulator 12 via AND gates 25 and 24 respectively.

The output pulse of the AND gate 19, which occurs at each third clock pulse from the oscillator 15, is supplied to a counter 28 which in this embodiment counts $N + 1$ output pulses of the counter 16 and after every $(N + 1)^{th}$ one of these output pulses supplies an output pulse to a counter 29. Just as in the embodiment shown in FIG. 1, the output pulse of the counter 28 denotes the end of a computing cycle. In this embodiment the counter 29 counts $m$ output pulses of the counter 28 and then itself supplies an output pulse. In the embodiment shown in FIG. 4 the output of the AND gate 17 and the outputs of the counters 28 and 29 are further connected in the manner shown to AND gates 30 and 31, a NAND gate 32, an OR gate 33 and an inverter 34.

Figure 5:
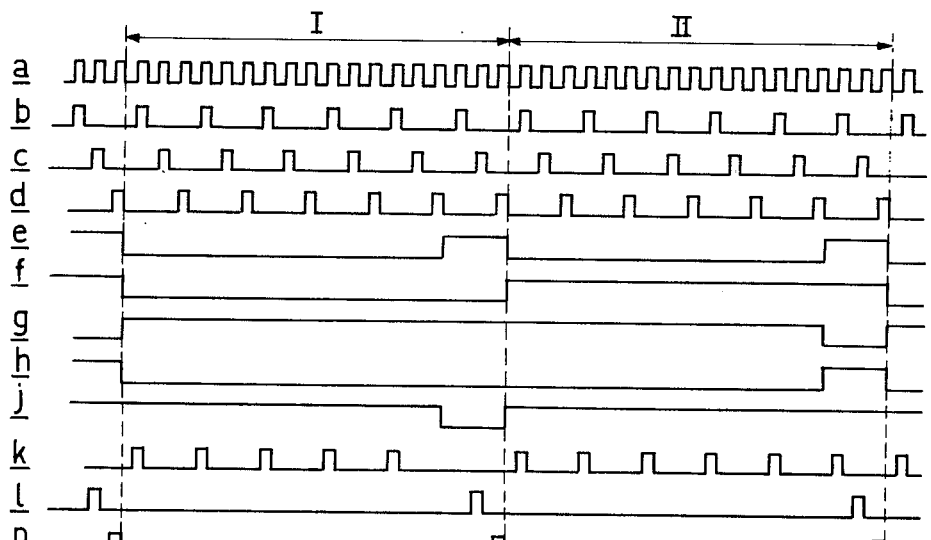
FIG. 5 shows waveforms illustrating the operation of the digital filter shown in FIG. 4.

The operation of the interpolating digital filter shown in FIG. 4 is illustrated, for the case in which $N = 5$ and $m = 2$, by the waveforms shown in FIG. 5 and by a Table II which is arranged in the same manner as Table I. In particular, FIG. 5a shows the pulse train generated by the oscillator 15. This train is divided in the manner shown into two computing cycles which each are characterized by 18 output pulses of the oscillator 15. These computing cycles are numbered I and II respectively. FIG. 5 further shows the output pulses of the AND gates 17, 18 and 19 at $b$, $c$, and $d$ respectively, the output pulses of the counters 28 and 29 at $e$ and $f$ respectively, and the output signals of the NAND gate 32, the AND gate 31 and the OR gate 33 at $g$, $h$ and $j$ respectively. The shift pulses for the register 9 which are derived from the AND gate 30 are shown at $k$. For completeness line 1 shows the pulse train delivered by the AND gate 25 for transferring the contents of the accumulator 12 to the buffer 14, and line $p$ shows the pulse train delivered by the AND gate 24 for resetting the accumulator 12 to zero on completion of a computing cycle.

On the occurrence of each first shift pulse in a computing cycle I, a new input code word is inserted in the register 9 while the oldest input code word stored is lost, for during this insertion the AND gate 4 is closed. The state of the shift register after the occurrence of each first shift pulse in a computing cycle I is shown in Table III by p.1.1 ($p = 1, 2, 3, 4$). Because during a first computing cycle, which is characterized in the Table by the shift register states for which $r = 1$, only five of the six output pulses of the AND gate 17 are supplied as shift pulses to the register 9, the shift register states p.1.5 and p.1.6 ($p = 1, 2, 3, 4$) are equal. The input code word stored in the last register section 10(4) in the said shift register states p.1.6, for example the code words $x(n)$, $x(n + 1)$ and $x(n + 2)$, then is multiplied only by a filter coefficient of zero value. As an alternative, the latter multiplication may be dispensed with. As is shown in FIG. 5k, in the embodiment under consideration, in which $m = 2$, during the last, i.e., second, computing cycle II the sixth output pulse of the AND gate 17 which occurs within this computing cycle is, however, supplied as a shift pulse to the shift register 9. As a result, on termination of each last computing cycle within an input sampling period the state of the register 9 is equal to the state of this register 9 immediately after the insertion of a new input code word at the beginning of the sampling period T considered. Compare the shift register state 1.2.5 and 1.1.1; 2.2.6 and 2.2.1; 3.2.6 and 3.1.1 in Table II. In these shift register states p.2.6 ($p = 1, 2, 3$) also the input code word stored in the shift register section 10(4) is not multiplied or multiplied by a filter coefficient of zero value.

That for the above-described interpolating digital filter a shift register having a periodically varying delay time is again realized can be illustrated with reference to column 10(4) of Table II. We will consider, for example, the code word $x(n - 1)$. Table II shows that for multiplication by a filter coefficient this code word is contained in the register section 10(4) in the shift register states 1.1.4, 1.2.4, 2.1.3, 2.2.3, 3.1.2, 3.2.2, 4.1.1. Because the interval between two consecutive shift register states is equal to a period $T/[m(N + 1)]$, the time interval between the shift register states 1.1.4 and 1.2.4 is equal to $6T/[m(N + 1)]$, that between the shift register states 1.2.4 and 2.1.3, however, is equal to $5T/[m(N + 1)]$ only, and so on.

Just as in the embodiment shown in FIG. 1, here also all the computing cycles are of equal duration and the output code words $y[(n + q/M)T]$ all occur at equidistant instants (compare in particular waveforms 1 and $p$ of FIG. 5).

It should be mentioned that in this embodiment the clock pulse generator 7 may be constructed so that each sixth output pulse of AND gate 17 within a first computing cycle I shifts the contents of the shift register 9, whereas the first output pulse of AND gate 17 in the second computing cycle does not effect such a shift. Also, the number of shift register states in which there is no multiplication of the code word stored in the last register section 10(4) by a filter coefficient may be more than one. Similarly to the embodiment shown in FIG. 1, in the embodiment shown in FIG. 4 more than the two output code words considered may be generated after the insertion of an input code word in the register 9. However, this again results in a proportional increase of the number of sets of filter coefficients.

REMARKS

In the embodiments described the register sections 10(.) are constructed so that a new input code word can only be written in the section 10(0) via AND gate 3 and OR gate 6 under control of a shift pulse from generator 7. However, at least the section 10(0) may be implemented by an element such that a new input code word can be written in it without a shift pulse being required. In this case, before the insertion of this new code word the oldest input code word also must be stored in the section 10(0). In contrast with the above-described embodiment the multiplier 11 then has an input connected to the input of this first section 10(0). Just as in the embodiment shown in FIG. 1, no additional shift pulses need be supplied to the shift register or be suppressed within a computing cycle. When such a section 10(0) is used and the clock pulse generator 7 is appropriately constructed the multiplier 11 may even have an input connected to an input of anyone register section 10(.) of the shift register 9.

Although in the embodiment described the input code words are stored in a circulating shift register, this may be replaced by an equivalent storage device such as, for example, a RAM. However, in this case the clock pulse generator must be constructed so that the interval between the instants at which a given input code word stored in this RAM is supplied to the multiplying device for multiplication by a filter coefficient varies periodically.

Finally it should be mentioned that with a suitable choice of the counter 16, which in the embodiments described is a divide-by-three counter, the frequency of the oscillator 15 may be in a different ratio to the shift frequency Nm/T.

TABLE I

| p.r.s. | 10(0) | 10(1) | 10(2) | 10(3) | 10(4) | 5 |
|---|---|---|---|---|---|---|
| 1.1.1 | x(n) | x(n−1) | x(n−2) | x(n−3) | x(n−4) | C(0,4) |
| 1.1.2 | x(n−4) | x(n) | x(n−1) | x(n−2) | x(n−3) | C(0,3) |
| 1.1.3 | x(n−3) | x(n−4) | x(n) | x(n−1) | x(n−2) | C(0,2) |
| 1.1.4 | x(n−2) | x(n−3) | x(n−4) | x(n) | x(n−1) | C(0,1) |
| 1.1.5 | x(n−1) | x(n−2) | x(n−3) | x(n−4) | x(n) | C(0,0) |
| 1.2.1 | x(n) | x(n−1) | x(n−2) | x(n−3) | x(n−4) | C(1,4) |
| 1.2.2 | x(n−3) | x(n) | x(n−1) | x(n−2) | x(n−3) | C(1,3) |
| 1.2.3 | x(n−2) | x(n−3) | x(n) | x(n−1) | x(n−2) | C(1,2) |
| 1.2.4 | x(n−1) | x(n−2) | x(n−3) | x(n) | x(n−1) | C(1,1) |
| 1.2.5 | x(n) | x(n−1) | x(n−2) | x(n−3) | x(n) | C(1,0) |
| 2.1.1 | x(n+1) | x(n) | x(n−1) | x(n−2) | x(n−3) | C(0,4) |
| 2.1.2 | x(n−3) | x(n+1) | x(n) | x(n−1) | x(n−2) | C(0,3) |
| 2.1.3 | x(n−2) | x(n−3) | x(n+1) | x(n) | x(n−1) | C(0,2) |
| 2.1.4 | x(n−1) | x(n−2) | x(n−3) | x(n+1) | x(n) | C(0,1) |
| 2.1.5 | x(n) | x(n−1) | x(n−2) | x(n−3) | x(n+1) | C(0,0) |
| 2.2.1 | x(n+1) | x(n) | x(n−1) | x(n−2) | x(n−3) | C(1,4) |
| 2.2.2 | x(n−2) | x(n+1) | x(n) | x(n−1) | x(n−2) | C(1,3) |
| 2.2.3 | x(n−1) | x(n−2) | x(n+1) | x(n) | x(n−1) | C(1,2) |
| 2.2.4 | x(n) | x(n−1) | x(n−2) | x(n+1) | x(n) | C(1,1) |
| 2.2.5 | x(n+1) | x(n) | x(n−1) | x(n−2) | x(n+1) | C(1,0) |
| 3.1.1 | x(n+2) | x(n+1) | x(n) | x(n−1) | x(n−2) | C(0,4) |
| 3.1.2 | x(n−2) | x(n+2) | x(n+1) | x(n) | x(n−1) | C(0,3) |
| 3.1.3 | x(n−1) | x(n−2) | x(n+2) | x(n+1) | x(n) | C(0,2) |
| 3.1.4 | x(n) | x(n−1) | x(n−2) | x(n+2) | x(n+1) | C(0,1) |
| 3.1.5 | x(n+1) | x(n) | x(n−1) | x(n−2) | x(n+2) | C(0,0) |
| 3.2.1 | x(n+2) | x(n+1) | x(n) | x(n−1) | x(n−2) | C(1,4) |
| 3.2.2 | x(n−1) | x(n+2) | x(n+1) | x(n) | x(n−1) | C(1,3) |
| 3.2.3 | x(n) | x(n−1) | x(n+2) | x(n+1) | x(n) | C(1,2) |
| 3.2.4 | x(n+1) | x(n) | x(n−1) | x(n+2) | x(n+1) | C(1,1) |
| 3.2.5 | x(n+2) | x(n+1) | x(n) | x(n−1) | x(n+2) | C(1,0) |
| 4.1.1 | x(n+3) | x(n+2) | x(n+1) | x(n) | x(n−1) | C(0,4) |

TABLE II

| p.r.s | 10(0) | 10(1) | 10(2) | 10(3) | 10(4) | 5 |
|---|---|---|---|---|---|---|
| 1.1.1 | x(n) | x(n−1) | x(n−2) | x(n−3) | x(n−4) | C(0,4) |
| 1.1.2 | x(n−4) | x(n) | x(n−1) | x(n−2) | x(n−3) | C(0,3) |
| 1.1.3 | x(n−3) | x(n−4) | x(n) | x(n−1) | x(n−2) | C(0,2) |
| 1.1.4 | x(n−2) | x(n−3) | x(n−4) | x(n) | x(n−1) | C(0,1) |
| 1.1.5 | x(n−1) | x(n−2) | x(n−3) | x(n−4) | x(n) | C(0,0) |
| 1.1.6 | x(n−1) | x(n−2) | x(n−3) | x(n−4) | x(n) | — |
| 1.2.1 | x(n) | x(n−1) | x(n−2) | x(n−3) | x(n−4) | C(1,4) |
| 1.2.2 | x(n−4) | x(n) | x(n−1) | x(n−2) | x(n−3) | C(1,3) |
| 1.2.3 | x(n−3) | x(n−4) | x(n) | x(n−1) | x(n−2) | C(1,2) |
| 1.2.4 | x(n−2) | x(n−3) | x(n−4) | x(n) | x(n−1) | C(1,1) |
| 1.2.5 | x(n−1) | x(n−2) | x(n−3) | x(n−4) | x(n) | C(1,0) |
| 1.2.6 | x(n) | x(n−1) | x(n−2) | x(n−3) | x(n−4) | — |
| 2.1.1 | x(n+1) | x(n) | x(n−1) | x(n−2) | x(n−3) | C(0,4) |
| 2.1.2 | x(n−3) | x(n+1) | x(n) | x(n−1) | x(n−2) | C(0,3) |
| 2.1.3 | x(n−2) | x(n−3) | x(n+1) | x(n) | x(n−1) | C(0,2) |
| 2.1.4 | x(n−1) | x(n−2) | x(n−3) | x(n+1) | x(n) | C(0,1) |
| 2.1.5 | x(n) | x(n−1) | x(n−2) | x(n−3) | x(n+1) | C(0,0) |
| 2.1.6 | x(n) | x(n−1) | x(n−2) | x(n−3) | x(n+1) | — |
| 2.2.1 | x(n+1) | x(n) | x(n−1) | x(n−2) | x(n−3) | C(1,4) |
| 2.2.2 | x(n−3) | x(n+1) | x(n) | x(n−1) | x(n−2) | C(1,3) |
| 2.2.3 | x(n−2) | x(n−3) | x(n+1) | x(n) | x(n−1) | C(1,2) |
| 2.2.4 | x(n−1) | x(n−2) | x(n−3) | x(n+1) | x(n) | C(1,1) |
| 2.2.5 | x(n) | x(n−1) | x(n−2) | x(n−3) | x(n+1) | C(1,0) |
| 2.2.6 | x(n+1) | x(n) | x(n−1) | x(n−2) | x(n−3) | — |
| 3.1.1 | x(n+2) | x(n+1) | x(n) | x(n−1) | x(n−2) | C(0,4) |
| 3.1.2 | x(n−2) | x(n+2) | x(n+1) | x(n) | x(n−1) | C(0,3) |
| 3.1.3 | x(n−1) | x(n−2) | x(n+2) | x(n+1) | x(n) | C(0,2) |
| 3.1.4 | x(n) | x(n−1) | x(n−2) | x(n+2) | x(n+1) | C(0,1) |
| 3.1.5 | x(n+1) | x(n) | x(n−1) | x(n−2) | x(n+2) | C(0,0) |
| 3.1.6 | x(n+1) | x(n) | x(n−1) | x(n−2) | x(n+2) | — |
| 3.2.1 | x(n+2) | x(n+1) | x(n) | x(n−1) | x(n−2) | C(1,4) |
| 3.2.2 | x(n−2) | x(n+2) | x(n+1) | x(n) | x(n−1) | C(1,3) |
| 3.2.3 | x(n−1) | x(n−2) | x(n+2) | x(n+1) | x(n) | C(1,2) |
| 3.2.4 | x(n) | x(n−1) | x(n−2) | x(n+2) | x(n+1) | C(1,1) |
| 3.2.5 | x(n+1) | x(n) | x(n−1) | x(n−2) | x(n+2) | C(1,0) |
| 4.1.1 | x(n+3) | x(n+2) | x(n+1) | x(n) | x(n−1) | C(0,4) |

What is claimed is:
1. A digital filter comprising
input means for supplying a sequence of signals with a predetermined first sampling frequency;
storage means having an input connected to said input means for storing a predetermined number of said signals, and having an output; comprising
a shift register having a predetermined number of register sections, the last section in the direction of shifting being connected to said output of said storage means;
multiplying means connected to the output of said storage means for multiplying said stored signals by a weighting factor and producing an output signal having a predetermined second sampling frequency; and means for controlling the output rate of said storage means to said multiplying means by control pulses so that said second sampling frequency is an integral multiple of said first sampling frequency, comprising means for providing a periodically varying storage time pulse to said storage means, including a first counting means for counting the number of shift pulses applied by said clock pulse generator, and second counting means connected to said first counting means for registering a predetermined count in said first counting means.

2. A digital filter as defined in claim 1, further comprising an adding device for receiving the output signal of said multiplying means for computing the mathematical sum of products computed by said multiplying means.

3. A digital filter as defined in claim 1, wherein said output of said storage means is connected to said input of said storage means.

4. A digital filter as defined in claim 1, wherein the input of said last register section is connected to said input of said storage means.

5. A digital filter as defined in claim 1, wherein the input and the output of said last register section are alternatively connected to said input of said storage means under control of said clock pulse generator.

6. A digital filter as defined in claim 1, wherein said second counting means counts to the predetermined integer M, wherein M is equal to the number of output code words which are to be generated within a predetermined input sampling.

7. A digital filter as defined in claim 1, wherein said first and second counting means are connected to suppressing means for suppressing at least one of the shift pulses of the cycle of shift pulses supplied to said shift register by said clock pulse generator.

* * * * *

UNITED STATES PATENT AND TRADEMARK OFFICE
CERTIFICATE OF CORRECTION

PATENT NO. : 3,988,607
DATED : October 26, 1976
INVENTOR(S) : LUDWIG D.J. EGGERMONT ET AL It is certified that error appears in the above—identified patent and that said Letters Patent are hereby corrected as shown below:

On the title page, section [30], "12224" should be --7412224--

Column 10, line 23, "Table III" should be --Table II--

Signed and Sealed this

Twenty-fourth Day of May 1977

[SEAL]

*Attest:*

RUTH C. MASON
*Attesting Officer*

C. MARSHALL DANN
*Commissioner of Patents and Trademarks*